Figure 1:
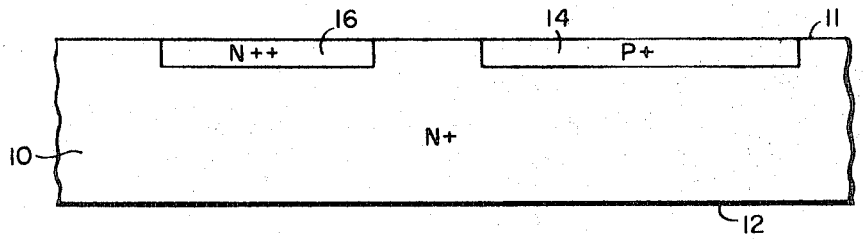
Figure 2:
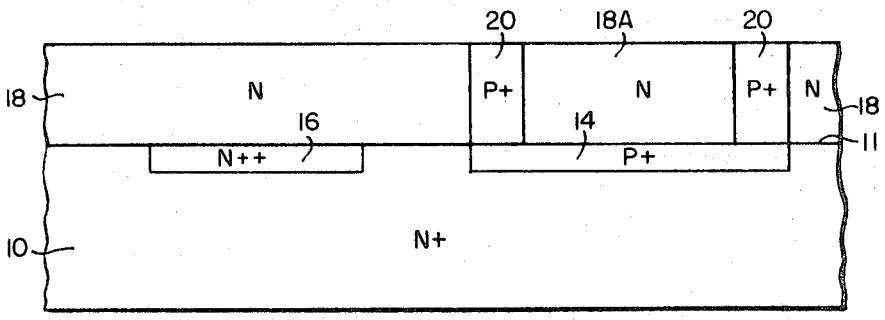
Figure 3:
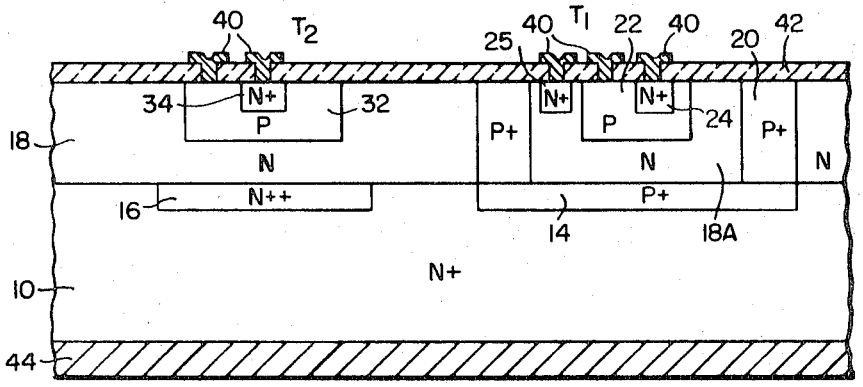
Figure 4:
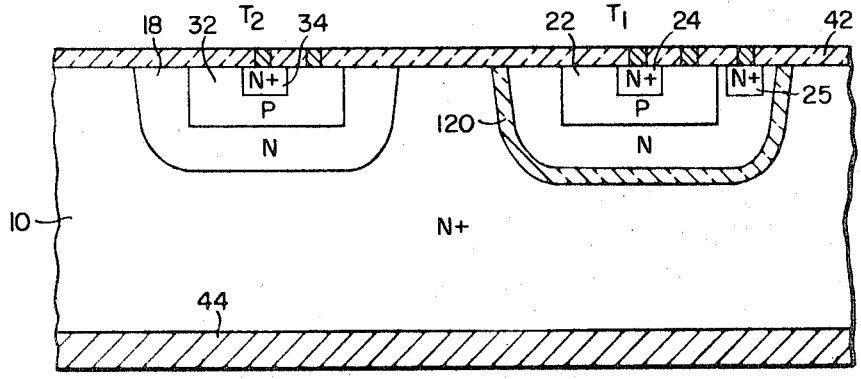

DEFENSIVE PUBLICATION

UNITED STATES PATENT OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent Office makes no assertion as to the novelty of the disclosed subject matter.

PUBLISHED NOVEMBER 30, 1971

892 O.G. 1604

T892,019

SEMICONDUCTOR INTEGRATED CIRCUIT WITH ISOLATED ELEMENTS AND POWER TRANSISTOR UTILIZING SUBSTRATE FOR LOW COLLECTOR RESISTANCE

Edgar A. Sack, 48 St. Andrews St., Severna Park, Md. 21146

Filed Jan. 27, 1969, Ser. No. 794,046
Int. Cl. H01l *19/00*
U.S. Cl. 317—235
1 Sheet Drawing. 8 Pages Specification

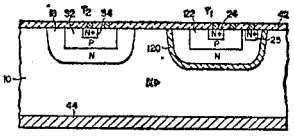

A substrate, preferably of low resistivity, can serve as a collector contact region of a power transistor as well as a support for other functional elements of an integrated circuit. An epitaxial layer on the surface of the substrate, of the same conductivity type but higher resistivity, contains other regions of functional elements. Isolation means such as PN junction forming regions or dielectric material, underlies and encloses those portions of the epitaxial layer to be isolated. Minimal collector resistance and increased power handling capability can be obtained with the power transistor structure without sacrificing isolation or complicating fabrication.

Nov. 30, 1971 E. A. SACK T892,019

SEMICONDUCTOR INTEGRATED CIRCUIT WITH ISOLATED ELEMENTS AND POWER TRANSISTOR UTILIZING SUBSTRATE FOR LOW COLLECTOR RESISTANCE

Filed Jan. 27, 1969

WITNESSES

Edwin E. Bassler

James F. Young

INVENTOR

Edgar A. Sack

BY Gordon W. Walker

ATTORNEY